United States Patent [19]

Byers

[11] Patent Number: 4,607,952
[45] Date of Patent: Aug. 26, 1986

[54] PHOTOGRAPHIC IMAGE PRECISION REPROPORTIONING SYSTEM

[76] Inventor: Thomas L. Byers, P.O. Box 26624, Oklahoma City, Okla. 73126

[21] Appl. No.: 676,336

[22] Filed: Nov. 29, 1984

[51] Int. Cl.$^4$ .................. G03B 27/10; G03B 27/68
[52] U.S. Cl. .................................. 355/84; 355/52; 355/133
[58] Field of Search ............... 355/84, 52, 78, 79, 355/133, 40

[56] References Cited

U.S. PATENT DOCUMENTS

| | | | |
|---|---|---|---|
| 2,740,324 | 4/1956 | Cahill, Jr. | 355/40 |
| 3,126,809 | 3/1964 | Adams et al. | 355/78 |
| 3,280,697 | 10/1966 | Henley | 355/40 |
| 3,445,165 | 5/1969 | Dubbs | 355/84 |
| 3,861,797 | 1/1975 | Nishida et al. | 355/52 |
| 4,420,249 | 12/1983 | Trump | 355/84 |
| 4,475,809 | 10/1984 | Byers | 355/52 X |
| 4,545,673 | 10/1985 | Bergsma | 355/52 |

Primary Examiner—L. T. Hix
Assistant Examiner—Della Rutledge
Attorney, Agent, or Firm—Robert K. Rhea

[57] ABSTRACT

A photographic reproportioning apparatus for changing one dimension of a two dimension image contact print exposed on a photosensitive film moved by a support plate in a predetermined linear direction with respect to the image being reproduced by a reversible synchronous motor. A stationary overlying film carriage supports the original image in contact with the photosensitive film. An opaque mask overlies the film support members and includes an aperture bar assembly moved by synchronous motors in the linear direction of movement of the sensitive film. The aperture bar assembly, interposed in the mask transversely of the direction of its movement, exposes the film from an overhead light source during movement of the mask.

13 Claims, 6 Drawing Figures

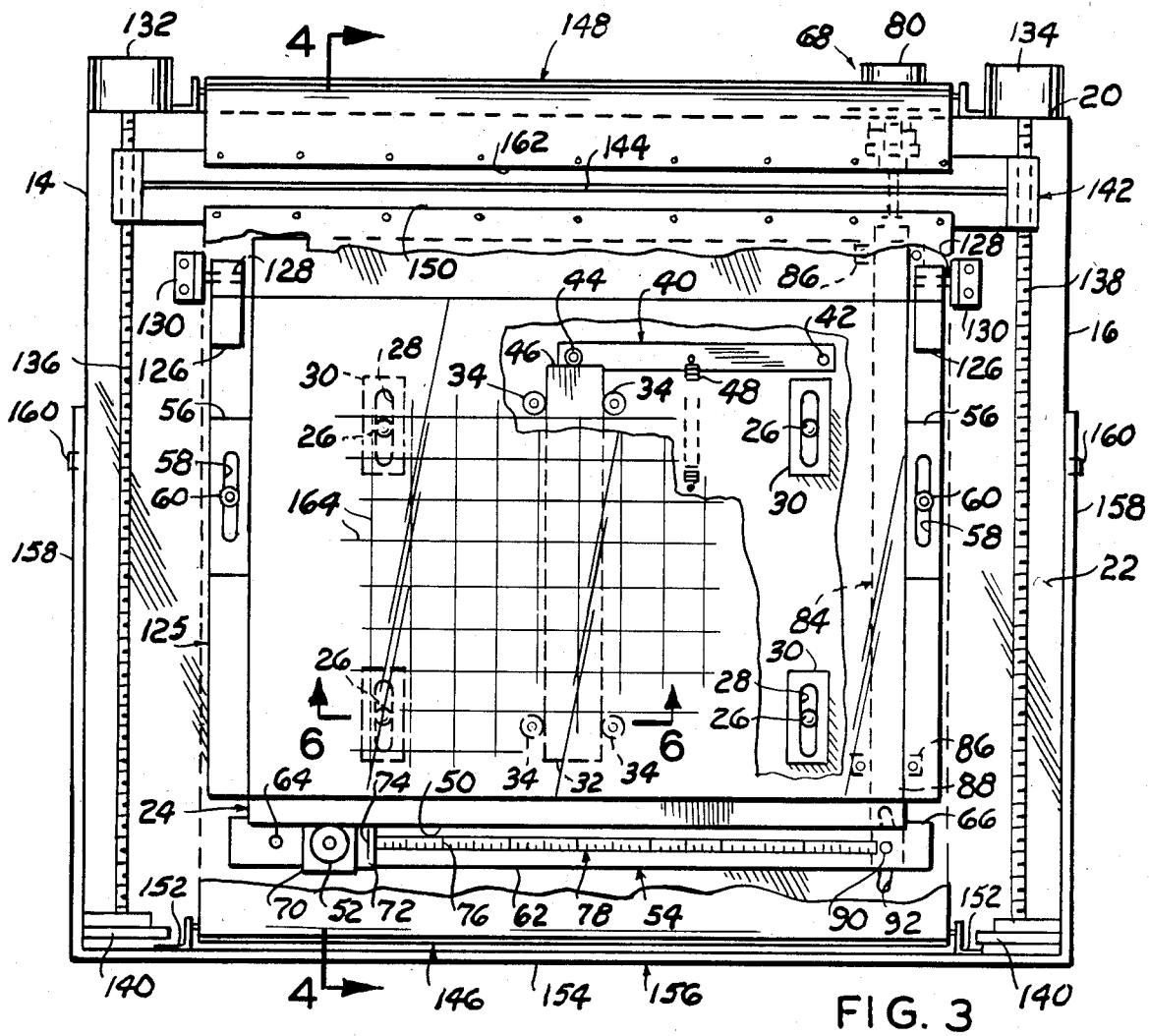
FIG. 3
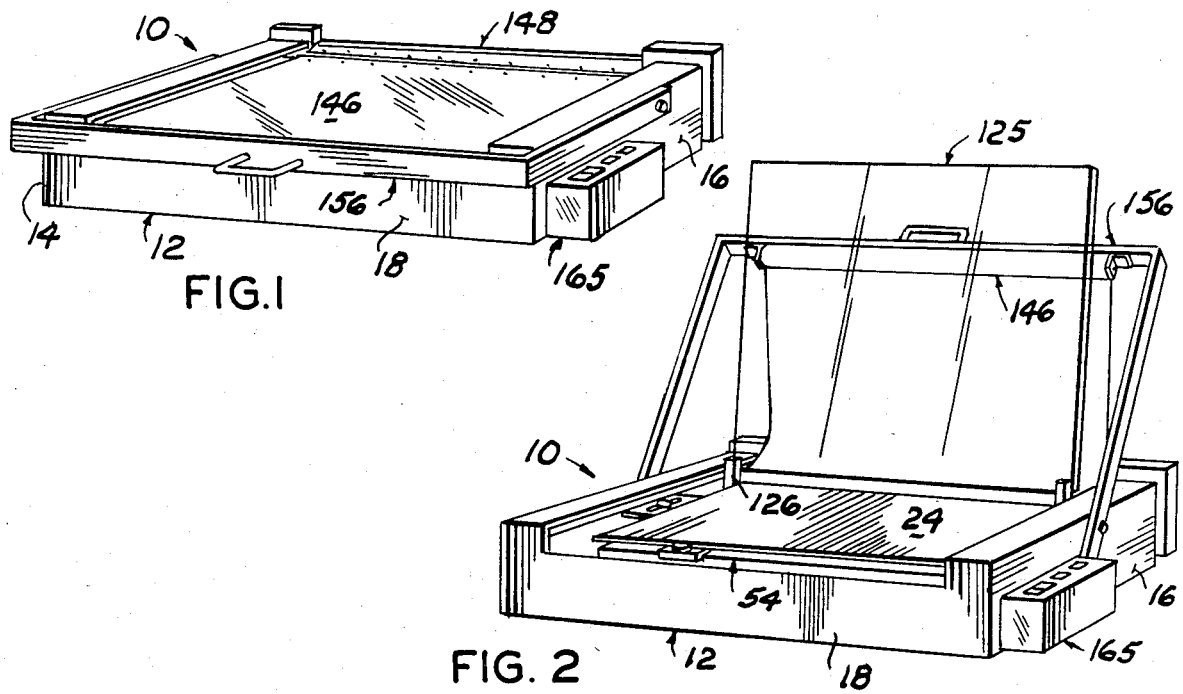
FIG. 1
FIG. 2

PHOTOGRAPHIC IMAGE PRECISION REPROPORTIONING SYSTEM

BACKGROUND OF THE INVENTION

1. Field of the Invention

The present invention relates to apparatus for changing one dimension of a two dimension photographic image by either enlarging or reducing the image along one of its dimensions.

In the reproduction of images contained by photographic film, as by printing, it is frequently desirable to alter or change the dimensions or appearance of an image on photographic paper which is commonly referred to as distortion. In the layout of artwork, as for example, illustrations and/or lettering the precise size of the artwork or lettering image is ordinarily not critical, however, in reproduction of some photo images on photosensitive paper measurements become critical when the images represent printed circuits to be laminated together in forming a final multilayered board. Extending one dimension of photographic print of a printed circuit is necessary for the reason that during lamination the substrate shrinks.

The device of this invention is capable of very precise photo image size adjustments, for example, in increments of one thousandths of one percent.

2. Description of the Prior Art

Several United States patents disclose photographic image distortion apparatus in which one dimension or the configuration of the image is changed with respect to the original image. Most of these prior art patents employ drive apparatus moving one photosheet mounting member relative to another at a different rate of speed and with respect to a source of light by utilizing gears and/or belt and pulley drives. The necessary tolerance between such operating components precludes precise repeatable minute setting measurements necessary in forming images for printed circuit boards.

Other known prior art apparatus is capable of providing incremental resolution equal with the capabilities of the present invention but accomplish this with precisely controlled stepper motors or variable speed drives. The stepper motor drives are relatively expensive and employ complex electronics and for this reason, it is believed, are not in general use. The variable speed drives are also relatively expensive and are not generally capable of precise repeatable results.

U.S. Pat. No. 3,126,809 discloses a photographic distortion apparatus utilizing a horizontal base provided with bar guide channels at opposite sides of the base for respectively moving a film support panel and a film mask having a lamp exposing slit with respect to a second film on the base. A motor driven shaft moves the light exposing slit and links connecting the mask and film panel to a fulcruming lever moves the film relative to the mask.

U.S. Pat. No. 3,445,165 discloses a device changing one dimension of a photographic image a predetermined dimension in one direction of the image. This device includes a stationary film exposing slit and source of light over a fixed frame which encloses a first mounting member moved rectilinear by a pinion and rack with respect to the light source and a second mounting member supporting the photographic image to be printed which is movable relative to and along the same line of rectilinear travel as the first mounting member. A linkage drive system operates to move the separate mounting structures for the image and film relative to the slit. The linkage system utilizes two angularly disposed rods carrying slide blocks. The relative movement between the separate supports are dependent on the angular positions of the rods.

The present invention is distinctive over the prior art apparatus by the simple and relatively few components utilized which are easily mounted in a novel fashion and are relatively inexpensive and requires minimal maintenance. The device is also distinctive over the above named patents by eliminating the members moved transversely to the rectilinear movement of the photographic image and photosensitive sheet mounting members and by moving only one photo image sheet mounting member and by moving the light exposure slit in the rectilinear direction of movement of the one image moving member.

SUMMARY OF THE INVENTION

A base frame horizontally supports an overlying platen mounted for rectilinear movement between the forward and rearward limits of the frame. The purpose of the platen is to support a photosensitive film. The platen is spring biased toward the front of the frame and its forward edge contacts a slider supported by a pivoting calibration bar which determines the magnitude of platen movement by a synchronous reversible motor driven shaft. A transparent planar carriage sheet is hingedly connected with the frame for vertical pivoting movement and normally overlies the platen. The purpose of the carriage sheet is to support a photographic film containing an image to be modified. A pair of synchronous reversible motors, mounted adjacent respective ends of the frame rearward wall, drive lead screws progressively moving a transversely disposed light aperture bar between forward and rearward end limits of the frame in overlying relation with respect to the platen and carriage for progressively exposing superposed contact printing film interposed between the platen and carriage from an overhead light source. A pair of opaque sheets, each connected at one end to respective sides of the light aperture slit and spring wound on rollers at their opposite end portions at the respective forward and rearward limit of the frame, shield the film from extraneous light prior to, during and following the exposure cycle. The platen motor, by moving the calibration bar, permits spring biased movement of the platen and sensitive film thereon relative to an original film mounted on the carriage during movement of the light aperture bar moved rectilinear in the direction of movement of the platen and sensitive film. The magnitude of such movement of the platen and sensitive film is determined by the slider setting on the calibration bar. The direction of rotation of the platen motor and movement of one end portion of the calibration bar in a forward or rearward direction determines whether the resulting reproportioned image is shortened or elongated.

The principal object of this invention is to provide a photographic image reproportioning apparatus for changing one dimension of a two dimension photo image in which the magnitude of change may be precisely determined and easily repeated and in which the exactness of change may be on the order of one thousandths of one percent or less.

BRIEF DESCRIPTION OF THE DRAWINGS

FIG. 1 is a perspective view of the apparatus in operative position;

FIG. 2 is a perspective view illustrating one light shield and its yoke in lifted position and illustrating, by dotted lines, the transparent film carriage in upwardly hinged position;

FIG. 3 is a top view, to an enlarged scale, of the device in the position of FIG. 1 with the shield removed and portions broken away for clarity;

DESCRIPTION OF THE PREFERRED EMBODIMENTS

Figure 4:
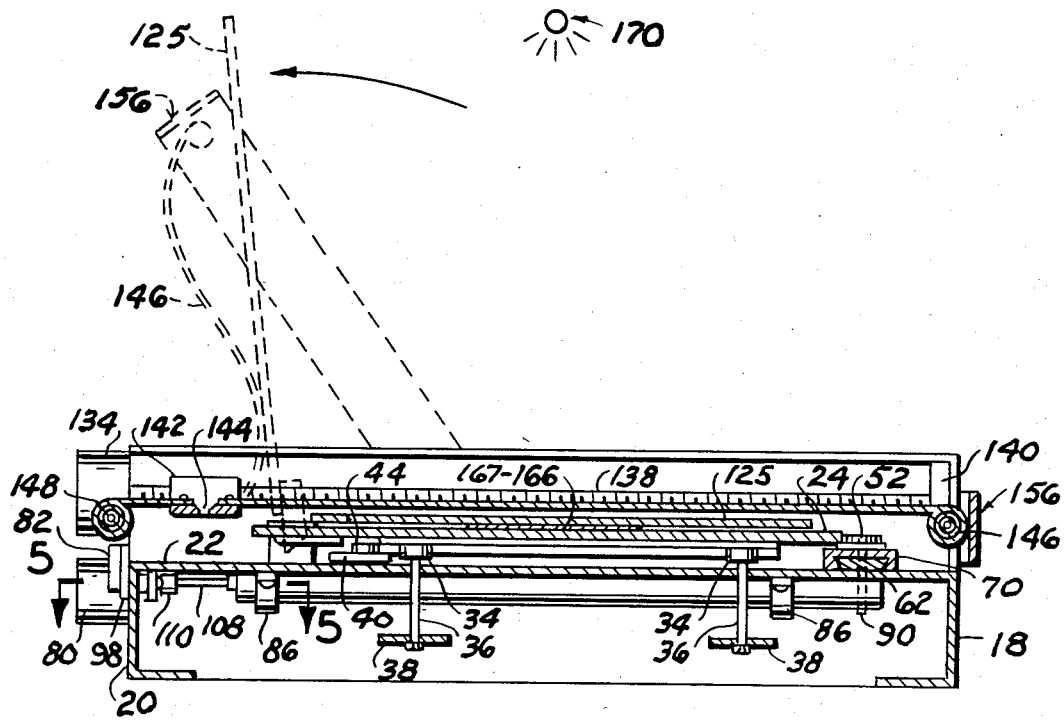
FIG. 4 is a vertical cross sectional view taken substantially along the line 4—4 of FIG. 3 and rotated 90° in a counterclockwise direction and illustrating, by dotted lines, the upwardly hinged position of the film light shield and film carriage.
Figure 5:
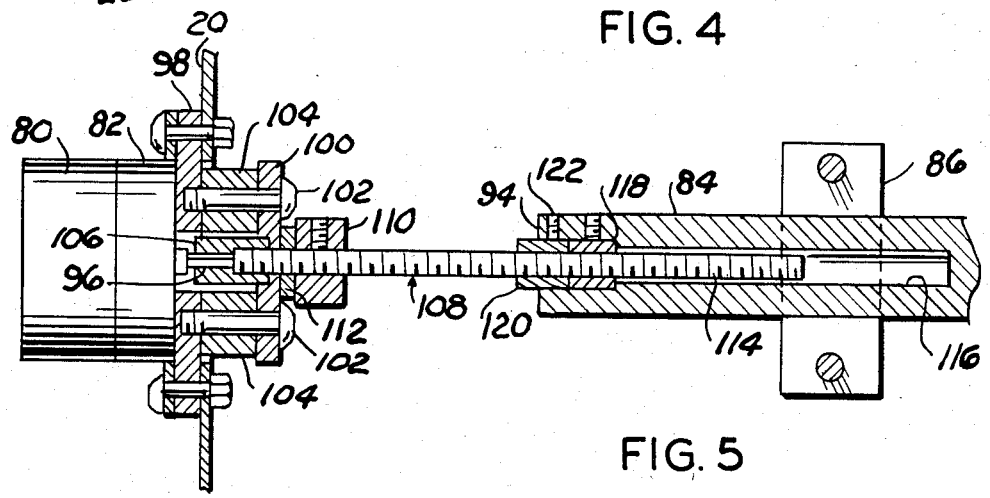
FIG. 5 is a fragmentary cross sectional view, to a larger scale, partially in elevation, taken substantially along the line 5—5 of FIG. 4; and, FIG. 6 is a fragmentary vertical cross sectional view, to a larger scale, taken substantially along the line 6—6 of FIG. 3.

Like characters of reference designate like parts in those figures, of the drawings in which they occur.

In the drawings:

The reference numeral 10 indicates the device, as a whole, which is rectilinear flat in general configuration comprising a base frame 12 having parallel sides 14 and 16, a front end 18 and a back or rear end 20. The frame is further characterized by a horizontal top panel 22 joined to the respective side and end walls.

Figure 6:
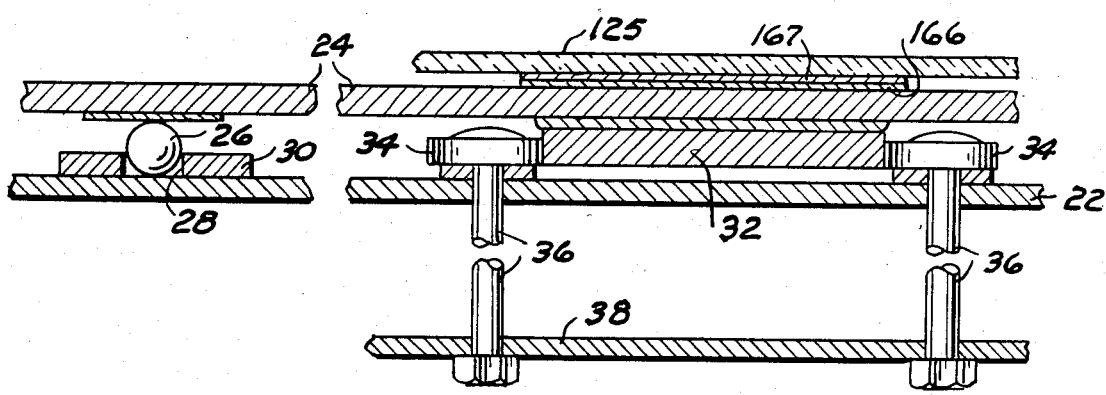

A rectangular glass platen 24, of smaller dimension than the frame top 22, horizontally overlies the frame top and is supported thereabove by a plurality of spherical bearings 26 (FIG. 6). The bearing spheres are disposed in a slot 28 formed in a plate guide 30 secured to the top surface of the frame top with the slot extending longitudinally of the frame, normal to the front and rear end walls, which permits forward and rearward rectilinear movement of the platen 24 relative to the frame top for the reasons and as more fully explained hereinbelow.

An elongated guide bar 32 underlies and is centrally secured to the platen 24 parallel with the respective sides of the frame and platen. A plurality, four in the example shown, of roller bearings 34 are mounted by pairs at respective sides of the bar 32. The bearings are each mounted on a shaft 36 projecting above the frame top 22 with the bottom end portion of the shaft 36 projecting through and secured to a frame brace plate 38 for the purpose of precluding a lateral movement of the respective bearing or its shaft 36. The bearings 34 are mounted with a portion of the periphery of each bearing in contact with the respective side surface of the platen guide bar 32. This manner of mounting eliminates any transverse movement of the platen 24 during its forward and rearward movement, as presently explained.

The platen 24 is constantly biased toward the forward end of the frame by a pivoting arm 40 pivotally secured at one end by a pin 42 to the frame top 22 adjacent one of its sides with its other end portion supporting a bearing 44 constantly maintained in contact with the rearward end surface 46 of the guide bar by a resilient member, such as a spring 48. A portion of the front edge surface 50 of the platen is thus maintained in contact with a wheel 52 mounted on a calibration bar means 54. The platen is further provided with an elongated transverse plate 56 interposed between the bottom surface of the platen and the guide bar 32. The respective end portion of the transverse plate, projecting beyond the respective side of the platen, is provided with an elongated slot 58 nesting a bearing or retainer 60 projecting above the frame top 22 for limiting forward, rearward and upward movement of the platen relative to the frame top.

The calibration bar means includes an elongated lever 62 which is pivotally mounted at one end portion by a dowel pin 64 projecting vertically into a pillow block rigidly mounted on the undersurface of the frame top 22 adjacent but spaced forwardly from the vertical plane of the forward end edge 50 of the platen. The calibration lever 62 is coextensive with the transverse dimension of the platen and its end portion 66 opposite the dowel pin 64 is secured to a calibration lever drive means 68 in the manner presently explained.

The calibration bar means 54 further includes a slider 70 extending transversely of the lever 62 intermediate its ends and is slidable therealong. The slider supports the wheel 52 and includes on its right edge portion, as viewed in FIG. 3, a transparent shield 72 having a scribe 74 thereon for coinciding alignment with any one of a plurality of indicia lines 76 extending transversely of the lever 62 medially its width. The lines 76 form a scale 78 extending between the respective end portions of the lever and divide the distance between the far left (zero position) and the far right (maximum position) of the slider 70, as viewed in FIG. 3, into equal increments, for example one thousand divisions. If the maximum position is one percent, each increment would represent one thousandth of one percent. Each one hundred increments would equal one tenth of one percent, etc.

The ratio of the scale 78 is determined by the ratio between the driving motors, as presently explained. Scale measurements to be obtained must be on the order of one thousandths of an inch or millimeters for printed circuit components and a percentage or fractions of a percent for use in flexographic printing where a rubber printing plate is wrapped around a cylinder.

As best shown by FIG. 4, the respective sides of the lever 62 converge downwardly and the respective side portions of the slider 70 have downwardly converging inner edge surfaces slidably contacting the respective sides of the lever in a dovetail type configuration to prevent lateral movement of the slider relative to the lever.

The platen drive means 68 comprises a reversible synchronous motor 80 mounted on the rearward end wall of the frame adjacent the frame side 16. The motor drives a gear train 82 in turn driving an actuator shaft 84 longitudinally underlying the frame top 22 and is slidably supported by bearing blocks 86 for forward and rearward axial movement, as presently explained.

The forward end portion 88 of the actuator shaft securely mounts a dowel 90 normal to the longitudinal axis of the shaft projecting upwardly through a suitable slot 92 formed in the frame top and is journalled by the swinging end portion 66 of the calibration bar means lever 62. The rearward end portion 94 of the actuator shaft is secured to the drive train output shaft 96 in a manner which eliminates any end play between the actuator shaft 84 and drive train output shaft 96. This is accomplished by a mounting plate 98 interposed between the drive train mounts and rear end wall 20 of the frame which supports a thrust plate 100 connected to the mounting plate 98 by bolts 102 through spacers 104 separating the plates 98 and 100. A drive collar 106, having one end axially spline connected with the gear train output 96 and its other end axially threaded, is interposed between the gear train and plate 100. One end of a threaded drive shaft 108 extends through the plate 100 and engages the threads of the drive bushing 106. A lock nut 110, on the threaded shaft 108, impinges a washer 112 interposed between the nut 110 and plate 100 to preclude end play in the thread pitch of the threaded shaft 108. Similarly, the other end portion 114 is axially disposed in an axial bore 116 of the actuator shaft end portion 94. An axially threaded cylinder 118 is rigidly secured in a counterbore in the actuator shaft and threadedly receives the drive shaft 108. A drive nut 120 surrounds the drive shaft 108 in contact with the threaded cylinder 118 and is secured in the shaft 84 counterbore by a set screw 122 to preclude any thread pitch tolerance end play of the drive shaft 108 relative to the actuator shaft 84. Thus when the motor 80 is operated in one direction the actuator shaft 84 is moved axially forward thus pivoting the calibration bar means end portion 66 toward the front of the frame and permitting the platen 24 to be similarly moved forwardly by the spring arm 40 biasing the platen forwardly in rectilinear movement. The magnitude of such movement of the just described components are determined by the setting of the slider longitudinally of the scale 78. A setting of the slider toward the calibration bar end portion 66 resulting in the greater magnitude of movement of the platen while a fully opposite position or setting of the slider on the calibration bar lever, wherein the axis of the wheel 52 and the mounting dowel 64 are in vertical alignment, results in no movement of the platen during forward or rearward movement of the actuator shaft 84 and end portion 66 of the calibration bar means. Conversely, operating the motor 80 in the opposite or reverse direction moves the end portion 66 of the calibration bar means toward the rearward end of the frame and similarly biases the platen 24 rearwardly by the wheel 52 contacting the platen edge surface 50 which overcomes the bias of the spring 48.

A planar transparent carriage sheet 125 flatly overlies the platen 24 substantially coextensive with the width thereof but having a front to back dimension slightly less than the platen in the example shown. The rearward corner portions of the carriage sheet are rigidly secured to rearwardly extending pillow blocks 126, each transversely supporting a horizontal dowel 128 with one end of the respective dowel journalled by zero tolerance synthetic material pillow block bearings mounted on hinge brackets 130 secured to the frame top 22 permitting vertical pivoting movement of the carriage toward and away from the top surface of the platen.

A pair of synchronous motors 132 and 134 are respectively secured to the respective end portion of the frame rearward end wall 20. The respective drive shaft of the motors is axially connected with an elongated drive screw 136 and 138 having its forward end journalled by upstanding frame plates 140. An aperture bar assembly 142 extends transversely between and is threadedly engaged at its respective end portions with the drive screws 136 and 138 so that rotation of the synchronous motors 132 and 134 in one direction moves the aperture bar assembly 142 toward the front end wall 14 until it has scanned the platen 24 and closes a limit switch, not shown, which reverses the pair of motors and moves the aperture bar assembly to its parked end wall 20 position. The aperture bar assembly is provided with an elongated light passing aperture or slit 144 extending longitudinally of the bar assembly transversely of the frame. The purpose of the aperture bar assembly is to expose film supported by the platen, as presently explained.

The drive motor 80 starts and reverses simultaneously with the motors 132 and 134. However, a switch provided determines whether it will run in the same or opposite direction as the other two motors. If the same direction is selected, the calibration bar will move forward as the aperture bar moves forward and the image exposed in this mode will be shortened. If the opposite direction is selected, the calibration bar will move backward as the aperture bar moves forward and the image exposed in this mode will be longer than the original.

As mentioned hereinabove, the value of the scale 78 is established by the ratio of angular rotation between the calibration lever drive motor 80 and the aperture bar drive motors 132 and 134. A ratio of 1:100 between these motors will produce a maximum distortion range of 1% or one part in 100. A ratio of 1:10 will produce a maximum distortion range of 10% or ten parts in 100. The drive ratios may be easily changed as desired for particular applications. A maximum distortion range of 1% is ideal for the printed circuit industry, while a maximum distortion range of 10 % is ideal for flexographic printing.

Mask means formed by roller blinds 146 and 148 prevent the film being exposed by light other than that which passes through the aperture 144 when the aperture bar assembly is moved, as presently explained.

The front blind 146 has its free end edge portion 150 attached to the aperture bar assembly 142 on the forward side of the light aperture 144. The wound up spring urged remainder of the blind is mounted in a conventional manner by brackets 152 on the bight portion 154 of a U-shaped yoke 156 having parallel legs 158 journalled at their respective end portions opposite the bight portion by pins 160 secured to respective frame sides 14 and 16 for vertical pivoting movement of the yoke and forward blind, for the reasons presently explained.

The rearward blind 148 has one end portion 162 similarly secured to the aperture bar assembly on the opposite side of the light aperture 144 in confronting relation with respect to the forward blind. The remaining spring wound up portion of the rearward blind is similarly mounted by conventional brackets on the rear end wall 20 of the frame.

A control box 165, containing a plurality of motor and lamp switches, is located at one side of the frame.

OPERATION

The platen is provided with a plurality of equally spaced crossed lines forming a grid pattern, a fragment of which is shown in FIG. 3 at 164. The purpose of the grid pattern is to guide the location of film on the platen.

In operation, the yoke and forward blind and the carriage sheet 125 are lifted, as illustrated by FIG. 2. A sheet of sensitive film 166 (FIG. 6) is flatly disposed on the upper surface of the platen 24 and secured thereto at its respective corner portions by double sided tape, not shown. A photographic film 167, containing an image to be reproduced, is superposed on the sensitive film with a section of double sided tape, not shown, overlying the respective corner portions of the topmost photographic film. The carriage sheet 125 is then manually lowered to overlie the platen and film thereon so that by manual pressure on the top surface of the carriage sheet, the photographic film 167 with the image is attached to the underside of the carriage in preselected registration with the underlying sheet of unexposed light sensitive film 166. Obviously, a registration pin system may be used for locating the film on the platen 24 and carriage sheet 125, if desired. The yoke and forward blind are then lowered to the position shown by FIG. 1.

If not previously done, the slider 70 is located at a predetermined position longitudinally of the lever 62 by aligning its scriber 74 with the preselected indicia dimension or percentage scribed line 76 in accordance with the predetermined shrink or enlargement desired for the image to be reproduced.

The scale setting of the slider 70 is determined by the following formula:

$$(F-O)/O=Z$$

Where: F is the final size or dimension desired for the film image to be reproduced; O is the dimension of the original image and Z is the desired scale setting in inches or centimeters. For a scale setting in percentages Z is multiplied by 100 to equal the desired scale setting.

The mode is selected which determines if the motor 80 will run in the same or the opposite direction as motors 132 and 134 will run during the cycle. The exposure lamp 170 may be energized either during the forward scan of the aperture only or during the forward and backward scans, referred to as one-way or two-way exposure selected by a switch.

When the exposure cycle is initiated, the aperture bar 142 and calibration lever 62 are set into motion and the overhead light 170 is energized overhead. Light passing through the aperture and the original exposes the film underneath. As the aperture bar moves forward, the calibration bar is moving the glass platen, carrying the film 166 forward or backward which, respectively, condenses or expands the image received by the film 166.

At the end of the forward and rearward scan of the aperture bar assembly 142 the motors are deenergized. The yoke and carriage sheet are then manually lifted and the sensitive film 166 removed and developed as is conventional thus completing one cycle of operation.

Obviously the invention is susceptible to changes or alterations without defeating its practicability. Therefore, I do not wish to be confined to the preferred embodiment shown in the drawings and described herein.

I claim:

1. A photographic image reproportioning apparatus, comprising:
    a base having a planar top;
    transparent carriage means overlying said top for supporting a photographic film having an image thereon;
    platen means interposed between said top and said carriage means for supporting a photosensitive sheet in printing contact with the photographic film;
    means mounting said platen means on said top for to and fro retilinear movement and normally biasing said platen means in one direction;
    manually adjustable calibration bar means contacting and movable with said platen means for limiting movement thereof to a predetermined film image dimension;
    light impervious mask means including an elongated sheet overlying said carriage means in the direction of platen movement and having a photo-light passing slit extending transversely of the direction of platen means travel for the passing of film exposure light therethrough;
    roller means at respective end portions of said sheet for winding up and paying out respective end portions of said sheet in response to movement of the mask slit;
    yoke means journalling one said roller means for vertical pivoting movement of one end portion of said sheet toward and away from said carriage means; and,
    motor driven means for simultaneously moving said mask slit and said calibration bar means in the same or opposite direction along the platen means travel path.

2. The apparatus according to claim 1 in which the motor driven means includes:
    a plurality of reversible synchronous motors respectively operatively connected with said mask means and said calibration bar means.

3. The apparatus according to claim 2 in which said calibration bar means includes:
    a lever pivotally connected at one end portion with said top and extending transversely of the direction of travel of said platen means for horizontal pivoting movement of its other end portion toward and away from said platen means; and,
    a slider slidable longitudinally of said lever,
    whereby the position of said slider relative to the ends of said lever determines the magnitude of movement of said platen means.

4. The apparatus according to claim 3 in which said mounting means includes:
    support bearing means interposed between said top and said platen means;
    guide bearing means contacting platen means opposing edge surfaces parallel with the direction of platen means movement; and,
    resilient means bearing against an edge surface of said platen means opposite said calibration bar means.

5. The apparatus according to claim 1 in which said platen means includes a plate and said mounting means includes:
    a plurality of plate support bearings interposed between said plate and said top;
    a plurality of guide bearings contacting opposing edge surfaces of said plate parallel with its direction of movement; and,
    resilient means bearing against an edge surface of said plate opposite said calibration bar means.

6. The apparatus according to claim 5 in which said calibration bar means includes:
    a lever pivotally connected at one end portion with said top adjacent said plate and extending transversely of the direction of plate travel for horizontal pivoting movement of its other end portion toward and away from said plate;
    a slider slidable longitudinally of said lever; and,
    a scale on said lever, whereby the position of said slider on said scale determines the magnitude of movement of said plate.

7. The apparatus according to claim 6 in which said motor driven means includes:
- a pair of motors respectively mounted on said base laterally of the path of movement of said platen means;
- a pair of drive screws journalled by said base and respectively angularly rotated by said pair of motors; and,
- means connecting said drive screws with said mask means at its slit position.

8. The apparatus according to claim 7 in which said motor driven means further includes:
- a third motor mounted on said base;
- shaft means connecting said third motor with said lever other end portion; and,
- control means including a source of electrical energy operatively connected with said motors.

9. A photographic image reproportioning apparatus, comprising:
- a frame having a top surface;
- a transparent carriage means overlying said top surface for supporting a photographic film having an image thereon;
- platen means interposed between said top surface and said carriage means for supporting a photosensitive film in printing contact with the photographic film;
- bearing means supporting and guiding said platen means for to and fro rectilinear movement;
- resilient means normally biasing said platen means in one direction;
- manually adjustable calibration bar means contacting and movable with said platen means for controlling the magnitude of movement thereof;
- light impervious mask means including an elongated sheet overlying said carriage means in the direction of platen movement and having a photo-light passing slit extending transversely of the direction of platen means travel for the passing of film exposure light therethrough;
- roller means at respective end portions of said sheet for winding up and paying out respective end portions of said sheet in response to movement of the mask slit;
- yoke means journalling one said roller means for vertical pivoting movement of one end portion of said sheet toward and away from said carriage means;
- a first motor drivably connected with said calibration bar means for movement thereof toward or away from the platen means; and,
- other motors drivably connected with said mask means for moving the mask slit in the same or opposite direction of calibration bar means movement.

10. The apparatus according to claim 9 in which said platen means includes a flat plate and said bearing means includes:
- support bearings interposed between said plate and said top surface; and,
- guide bearings contacting opposite side surfaces of said plate parallel with the direction of plate travel.

11. The apparatus according to claim 10 in which said calibration bar means includes:
- a lever pivotally connected at one end portion with said top surface and extending transversely of the direction of travel of said platen means for horizontal pivoting movement of its other end portion toward and away from said platen means;
- a slider longitudinally slidably supported by said lever; and,
- an elongated scale on said lever,
  whereby the position of said slider on said scale determines the magnitude of movement of said plate.

12. The apparatus according to claim 11 and further including:
- drive screws angularly rotated by said other motors and longitudinally journalled by said frame at respective sides thereof parallel with the platen means travel path; and,
- means connecting said mask means with the drive screws.

13. The apparatus according to claim 12 and further including:
- shaft means connected at one end with said lever other end portion;
- gear train and drive shaft means connecting said first motor with the other end of said shaft means; and,
- control means connected with a source of electrical energy for operating said motors,
  whereby the time span of movement of said lever other end portion in the to or fro direction coincides with the time span of movement of the mask slit in the respective to or fro direction.

* * * * *